United States Patent
Yamada et al.

(10) Patent No.: US 8,471,386 B2
(45) Date of Patent: Jun. 25, 2013

(54) JUNCTION BODY, SEMICONDUCTOR MODULE, AND MANUFACTURING METHOD FOR JUNCTION BODY

(75) Inventors: Yasushi Yamada, Miyoshi (JP); Hiroshi Osada, Komaki (JP); Yuji Yagi, Nisshin (JP); Tadafumi Yoshida, Nissin (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 150 days.

(21) Appl. No.: 13/148,150

(22) PCT Filed: Feb. 2, 2010

(86) PCT No.: PCT/IB2010/000193
§ 371 (c)(1),
(2), (4) Date: Aug. 5, 2011

(87) PCT Pub. No.: WO2010/089647
PCT Pub. Date: Aug. 12, 2010

(65) Prior Publication Data
US 2011/0291282 A1    Dec. 1, 2011

(30) Foreign Application Priority Data
Feb. 5, 2009  (JP) ................................. 2009-024874

(51) Int. Cl.
*H01L 23/48* (2006.01)

(52) U.S. Cl.
USPC ............ 257/772; 257/779; 257/E23.023; 257/E23.026; 257/E23.028; 257/E23.04; 257/E21.509; 438/612

(58) Field of Classification Search
USPC ............ 257/772, 779, E23.015, E23.02, 257/E23.023–E23.79, E21.508, E21.509, 257/E21.519; 438/612–617; 228/256
See application file for complete search history.

(56) References Cited

U.S. PATENT DOCUMENTS

| | | | |
|---|---|---|---|
| 3,358,898 A | | 12/1967 | Medkeff et al. |
| 3,839,727 A | * | 10/1974 | Herdzik et al. ............... 257/737 |
| 4,482,912 A | * | 11/1984 | Chiba et al. .................. 257/746 |
| 5,127,969 A | | 7/1992 | Sekhar |
| 5,520,752 A | | 5/1996 | Lucey, Jr. et al. |
| 6,095,400 A | | 8/2000 | Liu |

(Continued)

FOREIGN PATENT DOCUMENTS

| | | |
|---|---|---|
| EP | 1 582 287 A1 | 10/2005 |
| JP | 9-155585 A | 6/1997 |

(Continued)

OTHER PUBLICATIONS

Japanese Office Action issued Apr. 24, 2012 in corresponding Japanese Patent Application No. 2009-024874.

(Continued)

*Primary Examiner* — Jasmine Clark
(74) *Attorney, Agent, or Firm* — Sughrue Mion, PLLC (57) ABSTRACT

A junction body has a first member and a second member each of which is provided with a joining surface whose main component is copper. A solder member containing, in a tin-base solder material, a three-dimensional web structure whose main component is copper is provided between the first member and the second member. A copper-tin alloy whose average thickness is 2 μm or more but 20 μm or less is provided between the joining surfaces and the three-dimensional web structure.

32 Claims, 3 Drawing Sheets

U.S. PATENT DOCUMENTS

| | | | | |
|---|---|---|---|---|
| 6,563,225 | B2 * | 5/2003 | Soga et al. | 257/782 |
| 7,193,319 | B2 * | 3/2007 | Sasaki et al. | 257/724 |
| 8,283,783 | B2 * | 10/2012 | Yamada et al. | 257/772 |

FOREIGN PATENT DOCUMENTS

| | | |
|---|---|---|
| JP | 10-163270 A | 6/1998 |
| JP | 2004-174522 A | 6/2004 |
| JP | 2004-298962 A | 10/2004 |
| JP | 2006-237573 A | 9/2006 |
| JP | 2008-028295 A | 2/2008 |
| JP | 2008-200728 A | 9/2008 |
| JP | 2008-270353 A | 11/2008 |
| WO | 01/80611 A1 | 10/2001 |

OTHER PUBLICATIONS

Japanese Office Action for corresponding JP Patent Application No. 2009-024874 drafted Jun. 13, 2011.

International Search Report and Written Opinion for corresponding International Patent Application No. PCT/IB2010/000193 mailed May 11, 2010.

* cited by examiner

JUNCTION BODY, SEMICONDUCTOR MODULE, AND MANUFACTURING METHOD FOR JUNCTION BODY

BACKGROUND OF THE INVENTION

1. Field of the Invention

The invention relates to a junction body, a semiconductor module, and a manufacturing method for the junction body. More particularly, the invention relates to a junction body, a semiconductor module and a junction body manufacturing method that make unlikely the occurrence of defects, such as cracking, separation, etc., in thermal shock (hot/cold) cycles, or the like, and that therefore achieve high reliability.

2. Description of the Related Art

A semiconductor module usually has a configuration in which a semiconductor is provided with an electrical insulator so as to electrically insulate the semiconductor and a current conducting portion from each other. The semiconductor and the electrical insulator are joined by solder or the like.

Besides, a semiconductor module is provided with a heat radiating plate for efficiently dissipating heat, which is generated by a semiconductor element, or for temporarily dispersing such heat. The heat radiating plate and the electrical insulator are joined by solder or the like. Therefore, in the semiconductor module, it is a common practice to perform the joining at two sites, that is, between the semiconductor element and the electrical insulator, and between the electrical insulator and the heat radiating plate.

In the related technology, Pb-base solder materials have been used for the junctions at the two sites. In particular, a Pb—Sn solder material is used, and the melting point of the solder material is varied in the range of about 183 to 300° C. by changing the ratio between Pb and Sn, in order to perform the two processes of soldering (e.g., see "Approach to Securing Quality of HV Inverter" by Youichirou BABA, Reprints of the National Meeting of Japan Welding Society, chapter 77 (2005-9)). However, since lead (Pb) is poisonous, and therefore its use tends to be abolished or reduced. Hence, development of a Pb-free solder material is desired.

While such solder material is demanded, Sn-base solder materials having various compositions, such as an Sn—Ag alloy, an Sn—Cu alloy, etc., have been proposed. Known representative solder materials are Sn-3Ag-0.5Cu, Sn-0.7Cu, etc. However, the junction strength of the Sn-base solder material is weak. The tensile strength of the material conspicuously declines at and around 200° C., which is the melting point of the Sn-base solder material. Besides, if a stack joined by the Sn-base solder material is subjected to thermal shock cycles, thermal stress occurs due to the differences in thermal expansion coefficient between the joining members and the solder material. If the thermal stress is large, cracks and the like are formed in the joint portion, so that the heat resistance increases.

The Sn-base solder material has a yield stress of several tens MPa, and its strength is relatively low. Therefore, a composite material in which the solder is added to a foamed copper in order to improve the strength has been proposed (e.g., see Japanese Patent Application Publication No. 2004-298962 (JP-A-2004-298962), and Japanese Patent Application Publication No. 2008-200728 (JP-A-2008-200728)). In this composite material, the foamed copper is mixed in the solder in the fashion of a skeleton, so that the resistance of the material to the thermal shock cycles is high.

On another hand, a joining technology that replaces the soldering is a method in which copper (Cu) and tin (Sn) are used, and a $Cu_3Sn$ alloy is produced at or below the melting point of $Cu_3Sn$ (e.g., see Japanese Patent Application Publication No. 2008-28295 (JP-A-2008-28295)). In this technology, the solid-liquid reaction between Cu and Sn is utilized, and a high-melting-point and high-strength $Cu_3Sn$ alloy is produced for use for the joining.

SUMMARY OF THE INVENTION

The invention provides a junction body, a semiconductor module, and a junction body manufacturing method that make unlikely the occurrence of defects, such as cracking, separation, etc., in thermal shock cycles, and that therefore achieve high reliability.

A first aspect of the invention relates to a junction body. This junction body has: a first member having a first joining surface whose main component is copper; a second member having a second joining surface whose main component is copper; a solder member that is provided between the first joining surface and the second joining surface, and that contains, in a tin-base solder material, a three-dimensional web structure whose main component is copper; and a copper-tin alloy formed between the first joining surface and the three-dimensional web structure, and between the second joining surface and the three-dimensional web structure.

In the foregoing aspect of the invention, the solder member used for the joining between the first member and the second member each of which has a joining surface whose main component is copper is a tin-base solder material, and thus a lead-free configuration is realized. The tin-base solder material is usually weak against thermal stress. However, in this invention, since the three-dimensional web structure whose main component is copper is contained in the tin-base solder material, the strength of the tin-base solder material in this invention is several times higher than the strength of a tin-base solder material as a simple substance.

However, in the case where each of the joining surfaces and the three-dimensional web structure contains copper as a main component, since the melting point of copper is very high, that is, as high as about 1080° C., the joining surfaces and the three-dimensional web structure are not directly joined, but are joined via the tin-base solder material, which is weak against thermal stress. It has been revealed that if this configuration is subjected to thermal stress, such as thermal shock cycles or the like, there is likelihood of occurrence of cracking, separation, etc., from junction boundary portions.

To overcome this, a copper-tin alloy is provided between the joining surfaces and the three-dimensional web structure. This copper-tin alloy is produced due to the solid-liquid reaction between the copper of the joining surfaces and the three-dimensional web structure, and the tin of the tin-base solder material.

The copper-tin alloy has greater strength than copper, and also has advantage in melting point; for example, 640° C. in the case of $Cu_3Sn$, and 415° C. in the case of $Cu_6Sn_5$. Thus, since the three-dimensional web structure and the joining surfaces are joined by the copper-tin alloy that is excellent in strength and thermal stress resistance, the strength of the layered structural body as a whole improves. Thus, a structural body that does not easily break even when subjected to thermal stress, such as thermal shock cycles or the like, is obtained.

Incidentally, even if the boundary between copper and the copper-tin alloy is subjected to thermal shock cycles, no unnecessary product is generated at the boundary, or hardly any growth of an unnecessary product occurs if any generated. Therefore, in the junction body of the invention, defects, such as cracking, separation, etc., are less likely to occur even if the junction body is subjected to changes in temperature.

In the foregoing aspect, an average thickness of the copper-tin alloy may be 2 μm or more but 20 μm or less.

If the average thickness of the copper-tin alloy is 2 μm or more but 20 μm or less, the excellent effects of the copper-tin alloy are more fully realized. The foregoing range of the average thickness may also be appropriate, from the viewpoint of controlling the solid-liquid reaction so that a uniform copper-tin alloy layer is produced. Incidentally, if the joining is realized by a non-uniform copper-tin alloy, there occurs decline in the strength and the thermal stress resistance of the junction body.

In the foregoing configuration, the copper-tin alloy may contain at least one of $Cu_3Sn$ and $Cu_6Sn_5$.

The melting points of $Cu_3Sn$ and $Cu_6Sn_5$ are about 640° C. and about 415° C., respectively. Besides, $Cu_3Sn$ and $Cu_6Sn_5$ are excellent in strength as well. Hence, in the case where the copper-tin alloy is $Cu_3Sn$ or $Cu_6Sn_5$, there is provided a junction body that has a junction portion which is even higher in strength and excellent in thermal stress resistance, and that therefore does not easily break when subjected to thermal stress such as thermal shock cycles or the like.

In the foregoing configuration, an occupancy rate of the copper-tin alloy in the joining surface may be 2% or more but 50% or less.

If the occupancy rate of the copper-tin alloy in the joining surface is in the range of 2% to 50%, the thermal stress is likely to be lessened, in comparison with the case where a copper-tin alloy layer is formed over the entire surface of the joining surface. Hence, a junction body having a junction portion excellent in thermal stress resistance is provided, and a structural body that does not easily break even when subjected, to thermal stress, such as thermal shock cycles or the like, is provided.

In the foregoing configuration, a content rate of the three-dimensional web structure in the solder member may be 2% by volume or more but 50% by volume or less.

If the content rate of the three-dimensional web structure in the solder member is in the range of 2% by volume to 50% by volume, the strength and the thermal stress resistance of the solder member itself improve. Furthermore, the content rate of the three-dimensional web structure in that range is suitable to adjust the occupancy rate of the copper-tin alloy in the joining surface, so that the strength and the thermal stress resistance in the junction portion also improve.

In the foregoing configuration, a content rate of tin in the tin-base solder material may be 90% by mass or more.

In the foregoing configuration, the tin-base solder material may contain at least one element selected from the group consisting of silver (Ag), copper (Cu), antimony (Sb), bismuth (Bi), indium (In), and zinc (Zn).

In the foregoing configuration, the tin-base solder material may be Sn—Ag—Cu solder, Sn—Cu solder, Sn—Sb solder, Sn—Zn solder, Sn—Bi solder, Sn—In solder, Sn—Ag—Cu—Bi—In solder, or Sn—Ag—Cu—In solder.

The tin-base solder material may be tin as a simple substance (100% by mass). However, it is desirable that another element be added in order to improve the strength. From the viewpoint of the shortcoming of tin, that is, low strength, while fully realizing the advantages of tin, it is preferable that the content rate of tin in the tin-base solder material be 90% by mass or more. Besides, from the viewpoint of improving the strength, it is preferable that at least one element selected from the group consisting of silver (Ag), copper (Cu), antimony (Sb), bismuth (Bi), indium (In), and zinc (Zn) be added.

Concretely, examples of the tin-base solder material include Sn—Ag—Cu solder, Sn—Cu solder, Sn—Sb solder, Sn—Zn solder Sn—Bi solder, Sn—In solder, Sn—Ag—Cu—Bi—In solder, and Sn—Ag—Cu—In solder.

A second aspect of the invention relates to a semiconductor module. This semiconductor module has: a semiconductor element provided with a first joining surface whose main component is copper; an insulating substrate provided with a second joining surface whose main component is copper; a solder member that is provided between the first joining surface and the second joining surface, and that contains, in a tin-base solder material, a three-dimensional web structure whose main component is copper; a copper-tin alloy formed between the first joining surface and the three-dimensional web structure, and between the second joining surface and the three-dimensional web structure; and a heat radiating plate.

A third aspect of the invention relates to a semiconductor module. This semiconductor module has: an insulating substrate provided with a first joining surface whose main component is copper; a heat radiating plate provided with a second joining surface whose main component is copper; a solder member that is provided between the first joining surface and the second joining surface, and that contains, in a tin-base solder material, a three-dimensional web structure whose main component is copper; and a copper-tin alloy formed between the first joining surface and the three-dimensional web structure, and between the second joining surface and the three-dimensional web structure.

In the semiconductor module in the second and third aspects, at least one of the two junction portions, that is, the junction portion between the semiconductor element and the electrical insulator, and the junction portion between the electrical insulator and the heat radiating plate, has substantially the same configuration as the junction portion provided in the junction body. Hence, the second and third aspects provide a semiconductor module in which a lead-free configuration can be realized, and the strength of the solder material itself becomes high, and which has a junction portion that is high in strength and excellent in thermal stress resistance, and which does not easily break even when subjected to thermal stress such as thermal shock cycles or the like.

In the foregoing configuration, an average thickness of the copper-tin alloy may be 2 μm or more but 20 μm or less.

According to the foregoing configuration, since a uniform copper-tin alloy is provided, a semiconductor module that has a junction portion which is even higher in strength and excellent in thermal stress resistance, and that does not easily break even when subjected to thermal stress such as thermal shock cycles or the like.

In the foregoing configuration, the copper-tin alloy may contain at least one of $Cu_3Sn$ and $Cu_6Sn_5$.

According to the foregoing configuration, a semiconductor module that has a junction portion which is even higher in strength and excellent in thermal stress resistance, and that does not easily break even when subjected to thermal stress, such as thermal shock cycles or the like, is obtained.

In the foregoing configuration, an occupancy rate of the copper-tin alloy in the joining surface may be 2% or more but 50% or less.

According to this configuration, thermal stress is more likely to be lessened, so that a junction portion that is more excellent in thermal stress resistance is provided. Hence, a semiconductor module that does not easily break even when subjected to thermal stress, such as thermal shock cycles or the like, is obtained.

In the foregoing configuration, a content rate of the three-dimensional web structure in the solder member may be 2% by volume or more but 50% by volume or less.

According to this configuration, thermal stress is more likely to be lessened, so that a junction portion that is more excellent in thermal stress resistance is formed. Hence, a semiconductor module that does not easily break even when subjected to thermal stress, such as thermal shock cycles or the like, is obtained.

In the foregoing configuration, a content rate of tin in the tin-base solder material may be 90% by mass or more.

In this configuration, the tin-base solder material may contain at least one element selected from the group consisting of silver (Ag), copper (Cu), antimony (Sb), bismuth (Bi), indium (In) and zinc (Zn).

In the foregoing configuration, the tin-base solder material may be Sn—Ag—Cu solder, Sn—Cu solder, Sn—Sb solder, Sn—Zn solder, Sn—Bi solder, Sn—In solder, Sn—Ag—Cu—Bi—In solder, or Sn—Ag—Cu—In solder.

According to this configuration, a semiconductor module in which the strength of the solder material itself is further heightened is obtained.

In the foregoing configuration, the heat radiating plate may be a stack of a Cu layer, an Mo layer and a Cu layer in which the Cu layers are provided on two-opposite sides of the Mo layer.

The Cu/Mo/Cu stack is high in thermal conductivity, and effectively realizes functions as a heat radiating plate. Besides, the thermal expansion coefficient of the Cu/Mo/Cu stack is about 4 ppm/K, which is close to the value of thermal expansion coefficient of the semiconductor element. As a result, remarkable thermal stress does not occur during the thermal shock cycles, and therefore defects, such as cracking, separation, etc., do not occur. Besides, since the outermost layers of this stack are each constructed of a Cu layer, the stack can serve the role of the copper in the joining surface.

In the foregoing configuration, a thickness ratio of the Cu layer, the Mo layer and the Cu layer may be 1:5:1 to 1:12:1.

In the case where the ratio of the thicknesses of the Cu layer, the Mo layer and the Cu layer of the stack is 1:5:1 to 1:12:1, the balance between the thermal conductivity and the thermal expansion coefficient is particularly good, and the stack effectively performs functions as a heat radiating plate.

In the foregoing configuration, the insulating substrate may be an AlN or $Si_3N_4$ layer, and electrically conductive layers formed of Cu layers may be layered on two opposite sides of the AlN or $Si_3N_4$ layer.

According to this configuration, in the case where the electrically conductive layers provided on the surfaces of the insulating substrate are Cu layers, the high electrical conductivity of Cu allows the electrically conductive layers to be made thin, so that thermal stress can be lessened. Besides, the Cu layer on a surface of the insulating substrate is able to serve the role of the copper in the joining surface as well.

A fourth aspect of the invention relates to a junction body manufacturing method. This junction body manufacturing method includes: disposing a first member and a second member each of which has a joining surface whose main component is copper so that the joining surface of the first member and the joining surface of the second member face each other; disposing a solder member that contains, in a tin-base solder material, a three-dimensional web structure whose main component is copper, between the joining surface of the first member and the joining surface of the second member which face each other; producing a copper-tin alloy between the joining surface of the first member and the three-dimensional web structure, and between the joining surface of the second member and the three-dimensional web structure, by heating at a temperature that is higher than a melting point of the tin-base solder material but lower than a melting point of copper.

The melting point of the copper-tin alloy is, for example, about 640° C. if the copper-tin alloy is $Cu_3Sn$, and about 415° C. if the copper-tin alloy is $Cu_6Sn_5$. Therefore, if the copper-tin alloy is directly soldered, heating must be performed above such a melting point, so that operability declines and the manufacturing cost becomes high. Besides, in the case where the joining member is a semiconductor element, there is possibility of the semiconductor element breaking or changing in property due to the heating performed during the soldering.

Therefore, in this invention, the following method of forming the copper-tin alloy is employed. That is, joining members each having a joining surface whose main component is copper are placed so that the joining surfaces face each other. Then, a solder member containing, in a tin-base solder material, a three-dimensional web structure whose main component is copper is disposed between the joining surfaces. In this state, the melting and reaction is caused at a temperature that is higher than the melting point of the tin-base solder material and lower than the melting point of copper (Cu).

If the heating is performed at a temperature that is higher than the melting point of the tin (Sn)-base solder material and lower than the melting point of copper (Cu), only Sn melts and enters a liquid phase. At this time, since the heating is performed at a temperature below the melting point of Cu, the Cu phase remains the solid phase, and Cu in the solid phase and Sn in the liquid phase diffuse into each other, so that a copper-tin alloy is produced.

Therefore, according to the fourth aspect of the invention, it is appropriate to perform heating at temperature above the melting point of the tin-base solder material, and the operability in manufacture improves. Incidentally, the melting point of the tin-base solder material is about 220° C. in the case of tin as a simple substance, and can sometimes drop to about 200° C. depending on the kinds and amounts of additives.

That is, in the fourth aspect of the invention, the joining can be performed at temperature that is lower than the melting point of junction portion (copper-tin alloy) that has already been formed. Thus, the method of the fourth aspect is very useful from the viewpoint of operability and cost in manufacture. Besides, the melting point of the junction portion that has already been formed is considerably high, for example, 640° C. in the case of $Cu_3Sn$, and 415° C. in the case of $Cu_6Sn_5$. Therefore, defects, such as cracking, separation, etc., do not occur in the junction portion even under thermal stress, such as thermal shock cycles or the like.

In the foregoing configuration, an average thickness of the copper-tin alloy may be 2 μm or more but 20 μm or less.

In this configuration, adjustment is performed such that the average thickness of the copper-tin alloy becomes greater than or equal to 2 μm but less than or equal to 20 μm. By bringing the average thickness of the copper-tin alloy into the foregoing range, the excellent effects of the copper-tin alloy are more fully realized. The foregoing range of the average thickness may also be appropriate, from the viewpoint of controlling the solid-liquid reaction so that a uniform copper-tin alloy layer is produced. Incidentally if the joining is realized by a non-uniform copper-tin alloy, there occurs decline in the strength and thermal stress resistance of the junction body.

In the foregoing configuration, heating may be performed while positions of the joining surfaces and the three-dimensional web structure are adjusted so that an average thickness of the copper-tin alloy becomes 2 μm or more but 20 μm or less.

In the foregoing configuration, at least one of temperature of heating and duration of heating is adjusted so that the average thickness of the copper-tin alloy becomes 2 μm or more but 20 μm or less.

Examples of the method of adjusting the average thickness of the copper-tin alloy into the range of 2 μm to 20 μm include: (1) a method in which after the positions where the copper layers and the three-dimensional web structure are disposed are adjusted by using a jig or the like, the heating is performed while the adjusted state is maintained; (2) a method in which the heating duration and/or the heating temperature for the reaction between the copper solid and the tin liquid is adjusted; etc.

In the foregoing configuration, the copper-tin alloy may contain at least one of $Cu_3Sn$ and $Cu_6Sn_5$.

The copper-tin alloy produced by the reaction between the copper solid and the tin liquid is $Cu_3Sn$ or $Cu_6Sn_5$, and is high in strength and excellent in thermal stress resistance in both the case of $Cu_3Sn$ and the case of $Cu_6Sn_5$.

In the foregoing configuration, at least one of temperature of heating and duration of heating may be adjusted so that an occupancy rate of the copper-tin alloy in the joining surface of the first member and the joining surface of the second member becomes 2% or more but 50% or less in terms of length.

In the foregoing configuration, the solder member in which a content rate of the three-dimensional web structure is 2% by volume or more but 50% by volume or less may be used.

If the occupancy rate of the copper-tin alloy in the joining surfaces is in the range of 2% or more but 50% or less in terms of length, the thermal stress is likely to be lessened, so that a junction body excellent in thermal stress resistance is obtained. Examples of the method of bringing the occupancy rate of the copper-tin alloy in the joining surface into the foregoing range include a method in which at least one of (1) the content rate of the three-dimensional web structure in the solder member, (2) the heating temperature, and (3) the heating duration is adjusted. Incidentally, in the case where the content rate of the three-dimensional web structure is in the range of 2% by volume to 50% by volume, the strength and the thermal stress resistance of the solder member itself improve. Furthermore, the content rate of the three-dimensional web structure in that range is suitable to adjust the occupancy rate of the copper-tin alloy in the joining surface, so that the strength and the thermal stress resistance in the junction portion also improve.

In the foregoing configuration, the first member may be a semiconductor element, and the second member may be an insulating substrate, and the junction body may be a semiconductor module.

In the forgoing configuration, the first member may be an insulating substrate, and the second member may be a heat radiating plate, and the junction body may be a semiconductor module.

The foregoing manufacturing method is also applicable as a manufacturing method for a semiconductor module. Concretely, this application can be achieved merely by changing the joining bodies in the junction body manufacturing method to component members of the semiconductor module.

In the foregoing configuration, heating may be performed at 450° C. or lower.

In the case where the joining member is a semiconductor element, the joining may also be performed at a temperature of 450° C. or lower in order to sufficiently prevent the destruction or property modification of the semiconductor element caused by the heating.

According to the invention, it is possible to provide a junction body, a semiconductor module, and a junction body manufacturing method that make unlikely the occurrence of defects, such as cracking, separation, etc., in thermal shock cycles, and that therefore achieve high reliability.

BRIEF DESCRIPTION OF THE DRAWINGS

The features, advantages, and technical and industrial significance of this invention will be described in the following detailed description of example embodiments of the invention with reference to the accompanying drawings, in which like numerals denote like elements, and wherein.

DETAILED DESCRIPTION OF EMBODIMENTS

A junction body according to the invention includes a first member that has a joining surface whose main component is copper, and a second member that has a joining surface whose main component is copper. The junction body has, between the joining surface of the first member and the joining surface of the second member, a solder member that contains, in a tin-base solder material, a three-dimensional web structure whose component is copper. Furthermore, the junction body has a copper-tin alloy between each joining surface and the three-dimensional web structure. The average thickness of the copper-tin alloy may be greater than or equal to 2 μm, but less than or equal to 20 μm.

Figure 1A:
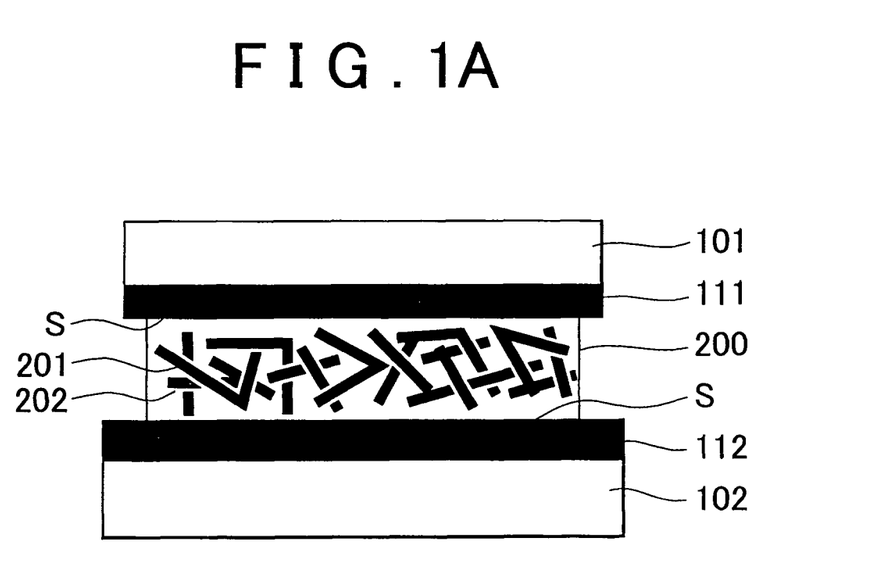
FIG. 1A is a diagram illustrating a configuration of a junction body before heating.
Figure 1B:
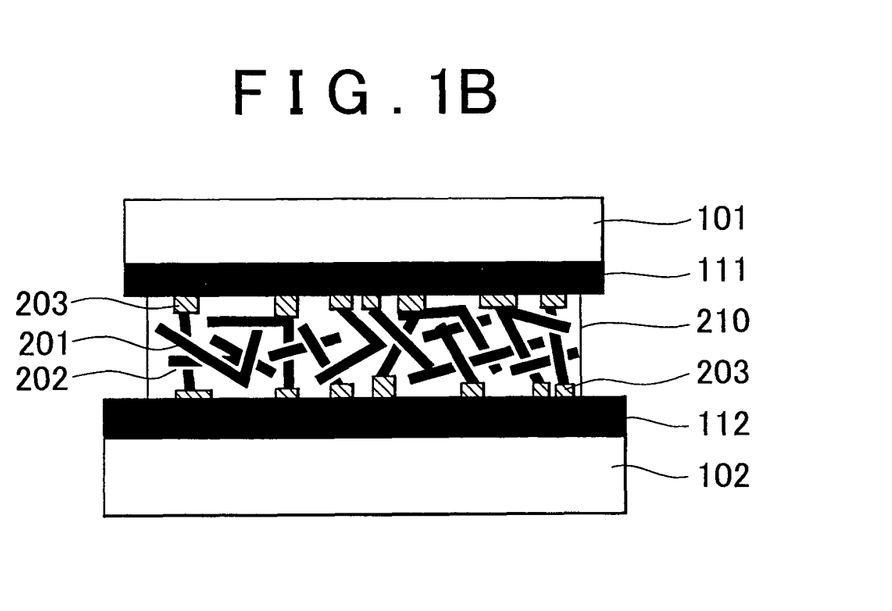
FIG. 1B is a diagram illustrating a configuration of the junction body after heating.

An example of a manufacturing method for a junction body in this embodiment is shown in FIGS. 1A and 1B. FIG. 1A is a diagram illustrating a configuration of the junction body before a heating and joining process, and FIG. 1B is a diagram illustrating the configuration of the junction body after the heating and joining process.

As shown in FIGS. 1A and 1B, the junction body in accordance with the embodiment has a first member 101 and a second member 102. It is to be noted herein that each of the first member 101 and the second member 102 has a joining surface S whose main component is copper. Each joining body (the first member 101 and the second member 102) may be constructed of a material whose main component is copper, or only the joining surface of each joining body may be provided with a layer whose main component is copper. A junction body having a first member 101 and a second member 102 in each of which a layer 111, 112 whose main component is copper (hereinafter, referred to as "copper layer 111, 112") is provided on a joining surface S.

Each joining surface S whose main component is copper (the copper layer 111, 112) may contain 50% by mass or more of copper, or may contain 70% by mass or more of copper, or may contain 90% by mass or more of copper. Besides, the joining surfaces S whose main component is copper (the copper layers 111, 112) may be constructed of copper alone or of a copper alloy. Examples of this copper alloy include Cu—Ag alloy, Cu—Zn alloy, Cu—Cr alloy, Cu—Cr—Zr alloy, etc.

As shown in FIG. 1A, a solder member 200 (hereinafter, sometimes referred to as "solder member in accordance with the invention") containing a three-dimensional web structure 201 whose main component is copper in a tin-base solder material 202 is disposed between the copper layers 111 and 112 that face each other.

Examples of the three-dimensional web structure 201 include so-called foamed metal materials, copper fiber knits, fiber-like copper bundles, etc.

The three-dimensional web structure 201 contains copper as a main component. In this embodiment, the expression "whose main component is copper" means containing copper in an amount of 50% by mass or more. From the viewpoint of the high strength and thermal stress attributed to copper and the high heat conductivity, the three-dimensional web structure 201 may contain 70% by mass of copper. Besides, the three-dimensional web structure whose main component is copper may be constructed of copper alone or a copper alloy.

Examples of the copper alloy that constitutes the three-dimensional web structure include Cu—Ag alloy, Cu—Zn alloy, Cu—Cr alloy, Cu—Cr—Zr alloy, etc.

The tin-base solder material 202 may contain 50% by mass or more of tin, and may also contain 90% by mass or more of tin. Besides, the tin-base solder material may be tin alone (100% by mass), and may also contain other elements in order to improve the strength of tin.

Examples of the element added to the tin-base solder material 202 include silver (Ag), copper (Cu), antimony (Sb), bismuth (Bi), indium (In), and zinc (Zn). Besides, at least one element selected from Ag, Cu, Bi, In, and Zn may be added into the tin-base solder material 202.

Concrete examples of the tin-base solder material 202 include Sn—Ag—Cu solder, Sn—Cu solder, Sn—Sb solder, Sn—Zn solder, Sn—Bi solder, Sn—In solder, Sn—Ag—Cu—Bi—In solder, and Sn—Ag—Cu—In solder. Among these solders, Sn—Ag—Cu solder, Sn—Cu solder, Sn—Sb solder, Sn—Zn solder, Sn—Ag—Cu—Bi—In solder, or Sn—Ag—Cu—In solder may be used as the tin-base solder material 202, from the viewpoint of strength.

To adjust the occupancy rate of the copper-tin alloy in the joining surface while maintaining the advantages of the three-dimensional web structure, the content rate of the three-dimensional web structure 201 in the solder member 200 may be 2% by volume or more but 50% by volume or less, or may also be 5% by volume or more but 30% by volume or less.

The thickness of the solder member 200 in accordance with the invention, considering the strength of the junction portions, may be greater than or equal to 10 μm but less than or equal to the 500 μm, and may be greater than or equal to 30 μm but less than or equal to 300 μm, and may be greater than or equal to 50 μm but less than or equal to 200 μm.

Besides, in order to form a copper-tin alloy between the three-dimensional web structure 201 and each joining surface S after the joining process, it is preferable that the three-dimensional web structure 201 be not exposed from a junction surface of the solder member 200 in accordance with the invention, and the position of external surfaces of the three-dimensional web structure 201 may be 2 μm or more but 50 μm or less inward from the junction surface of the solder member 200, and may also be 5 μm or more but 20 μm or less inward from the junction surface of the solder member 200.

The foamed metal material, and the tin-base solder material containing the foamed metal material can be manufactured with reference to the manufacturing method described in Japanese Patent Application Publication No. 2004-298952 (JP-A-2004-298952), or the like. Besides, a solder-impregnation foamed copper made by Mitsubishi Materials Corporation, or the like, may be contained in the tin-base solder material.

The solder member 200 is disposed between the copper layers 111 and 112 that face each other, as shown in FIG. 1A, and then is heated to form a copper-tin alloy 203 between the three-dimensional web structure 201 and the copper layers 111 and 112 as shown in FIG. 1B. Thus, a junction body that has a junction portion 210 is obtained. The heating process herein is performed at temperature that is higher than the melting point of the tin (Sn)-base solder material and lower than the melting point of copper (Cu). Due to the heating at such temperature, tin melts to form a liquid phase, while copper does not melt but exists in a state of solid phase. Then, diffusion of the solid-phase copper and the liquid-phase tin into each other occurs, so as to produce the copper-tin alloy 203.

The copper-tin alloy 203 includes at least $Cu_3Sn$ or $Cu_6Sn_5$, and may contain $Cu_3Sn$. The melting points of $Cu_3Sn$ and $Cu_6Sn_5$ are about 640° C. and about 415° C., respectively.

In the junction body manufacturing method according to the invention, it is possible to perform the joining at temperature that is lower than the melting point of a junction portion (the copper-tin alloy 203) that has already been formed. Thus, the manufacturing method of the invention is useful from the viewpoint of operability and cost in the manufacture. Besides, the melting point of the junction portion (the copper-tin alloy 203) that has already been formed is considerably high, that is, as high as, for example, about 640° C. if the copper-tin alloy 203 is $Cu_3Sn$, and about 415° C. if the copper-tin alloy 203 is $Cu_6Sn_5$. Therefore, even if the junction portion is subjected to thermal stress, such as thermal shock cycles or the like, no defect, such as cracking, separation, etc., will result in the junction portion.

As for the heating temperature, from the viewpoint of increasing the rate of the reaction between the copper solid and the tin liquid, the heating may be performed at temperature that is higher than the melting point of the tin-base solder material 202 by about 30° C. to 200° C., and may also be performed at temperature that is higher than the melting point thereof by 50° C. or more, and, furthermore, may also be performed at temperature that is higher than the melting point thereof by 100° C. or more. On the other hand, in the case where the joining member is a semiconductor element, the heating may also be carried out at 450° C. or lower, in order to prevent the destruction or property modification of the semiconductor element caused by the heating.

The heating is performed in an inactive-gas or reducing-gas atmosphere, from the viewpoint of preventing oxidation. Besides, in order to restrain the warpage of a solder member or a joining member caused by heating, it is also possible to perform the heating while applying load in the stacking direction (the up-down direction in FIG. 1A).

Besides, in the junction body manufacturing method in the invention, an adjustment may be performed so that the average thickness of the copper-tin alloy 203 is 2 μm or more and 20 μm or less. If the average thickness of the copper-tin alloy 203 is less than 2 μm, it sometimes becomes difficult to obtain an effect of heightening the joint strength and the thermal stress resistance through the use of the copper-tin alloy. It is also difficult to adjust the average thickness thereof to less than 2 μm by controlling the reaction between the copper solid and the tin liquid. Besides, it is also difficult to produce a uniform copper-tin alloy whose thickness exceeds 20 μm, through the reaction between the copper solid and the tin liquid. Incidentally, a copper-tin alloy formed so as to have a thickness of 2 μm or more and 20 μm or less was analyzed, and it was confirmed that the copper-tin alloy was uniform. Besides, the average thickness of the copper-tin alloy may also be adjusted to 5 μm or more and 10 μm or less.

The copper-tin alloy forms initially at the boundary between the solid-phase copper and the liquid-phase tin, and then the alloy continues to grow until the supply of either one of tin and copper ends. In the stack prior to a joining process shown in FIG. 1A, copper and tin are present in sufficient amounts, so that the alloy continues to form until the heating is stopped.

Examples of the method of adjusting the average thickness of the copper/tin alloy into the foregoing range include: (1) a method in which after the positions where the copper layers 111 and 112 and the three-dimensional web structure 201 are disposed are adjusted by using a jig or the like, the heating is performed while the adjusted state is maintained; and (2) a method in which the heating duration and/or the heating temperature for the reaction between the copper solid and the tin liquid is adjusted.

Concretely examples of the method (1) include: (i) a method in which, using a solder member 200 whose surface is covered with a tin-base solder material, the distances between the three-dimensional web structure 201 and the copper layers 111 and 112 are adjusted by adjusting the thickness of the tin-base solder material on the surface of the solder member 200; (ii) a method in which load is applied to a joining body, and adjustment is performed on the basis of the load; (iii) a method in which a substrate is provided with a portion that is not wetted by solder, and the average thickness of the copper/tin is adjusted by the spread of solder; etc.

The heating duration may be adjusted depending on the balance among the heating temperature, the content rate of the tin-base solder material 202 in the solder member 200, etc. For example, in the case where a solder member 200 containing 10% by mass of the three-dimensional web-like structure body 201 is used and where the heating temperature is 350° C., the heating duration may be 5 minutes or longer but 60 minutes or shorter, or may also be 10 minutes or longer but 30 minutes or shorter. Besides, in the case where a solder member 200 containing 30% by mass of the three-dimensional web structure 201 is used and where the heating temperature is 400° C., the heating duration may be 5 minutes or longer but 60 minutes or shorter, or may also be 10 minutes or longer but 30 minutes or shorter.

The average thickness of the copper-tin alloy 203 can be measured by the following method. The method will be described with reference to FIG. 2. A cross-section of a post-joining junction body is observed using an electron microscope, or observed in a non-destructive inspection. Referring to the observation diagram (FIG. 2), heights of the copper-tin alloy 203 (Z1 to Z4 in FIG. 2) are measured, and an average value thereof ((Z1+Z2+Z3+Z4)/4 in FIG. 2) is obtained.

Besides, if the proportion of the copper-tin alloy 203 present in the joining surfaces of the copper layers 111 and 112 is in the range of 2% or more but 50% or less of the length of the copper layers 111 and 112, the thermal stress is likely to be lessened, so that a junction body excellent in thermal stress resistance is obtained. Besides, if the proportion of the copper-tin alloy 203 present in the joining surfaces is in the range of 10% to 30%, a junction body with further improved thermal stress resistance is obtained.

Example of the method of causing the occupancy rate of the copper-tin alloy in the joining surface to be within the foregoing range include methods in which at least one of (1) the content rate of the three-dimensional web structure in the solder member, (2) the heating temperature, (3) the heating duration, (4) the load on the joining body, and (5) the spread of solder is adjusted. Among these methods, methods in which at least one of the factors (1), (2) and (3) is adjusted are preferable from the viewpoint of operability.

The proportion of the copper-tin alloy present in the joining surface of each of the copper layers 111 and 112 can be measured by the following method. The method will be described with reference to FIG. 2. A cross-section of a post-joining junction body is observed using an electron microscope, or observed in a non-destructive inspection. Referring to the observation diagram (enclosed by a dotted line in FIG. 2), the sum of lengths of the copper-tin alloy 203 in contact with the joining surface S (the sum of X1 to X4 in FIG. 2) is calculated, and then is divided by the length of the joining surface S (Y in FIG. 2), and is multiplied by 100. Therefore, the occupancy rate of the copper-tin alloy in the joining surface is calculated using the following expression.

Figure 2:
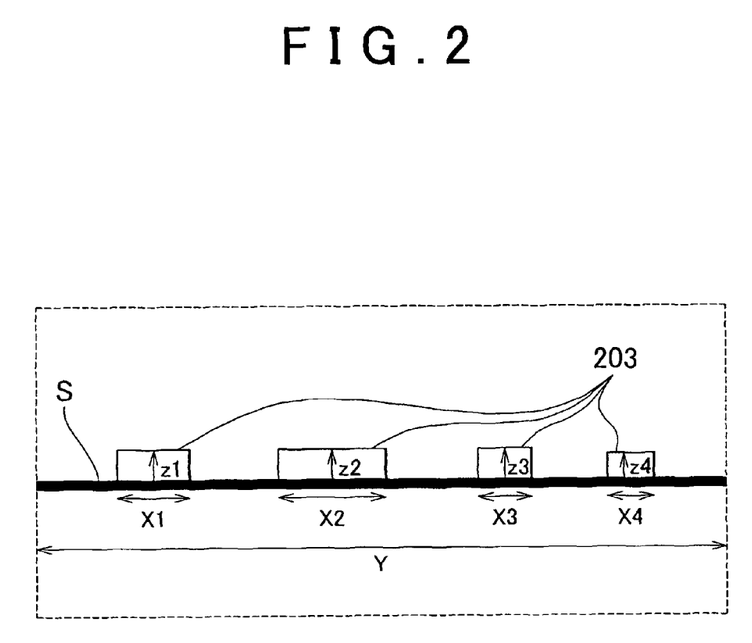
FIG. 2 is a diagram illustrating a method of measuring the thickness of a copper-tin alloy in a junction body (semiconductor module) according to the invention, and of measuring the occupancy rate of the copper-tin alloy in a joining surface.

The occupancy rate of the copper-tin alloy in the joining surface(%)=[(length of the copper-tin alloy in contact with the joining surface)/(length of the joining surface)]×100   (expression)

As for the junction body of the invention, since the three-dimensional web structure and the joining surfaces are joined by a copper-tin alloy that is excellent in strength and thermal stress resistance, the strength of the layered structural body as a whole improves. Thus, a structural body that does not easily break even when subjected to thermal stress, such as thermal shock cycles or the like, is obtained. As a result, expansion of the difference in thermal expansion coefficient between component materials is permitted, so that various component materials can be adopted and a low-cost junction body (e.g., a low-cost electric power transformer, or the like) can be realized.

Besides, even if the boundary between the copper of each joining surface and the copper-tin alloy of the junction member is subjected to thermal shock cycles, no unnecessary product is generated at the boundary, or hardly any growth of an unnecessary product occurs even if the unnecessary product is generated. Therefore, in the junction body of the invention, the resistance to changes in temperature heightens.

Furthermore, since the three-dimensional web structure 201 contained in the solder member 200 contains highly heat-conductive copper as a main component, the heat conductivity of the junction body also increases as compared with the case where the solder member 200 contains only the tin-base solder material 202.

Figure 3:
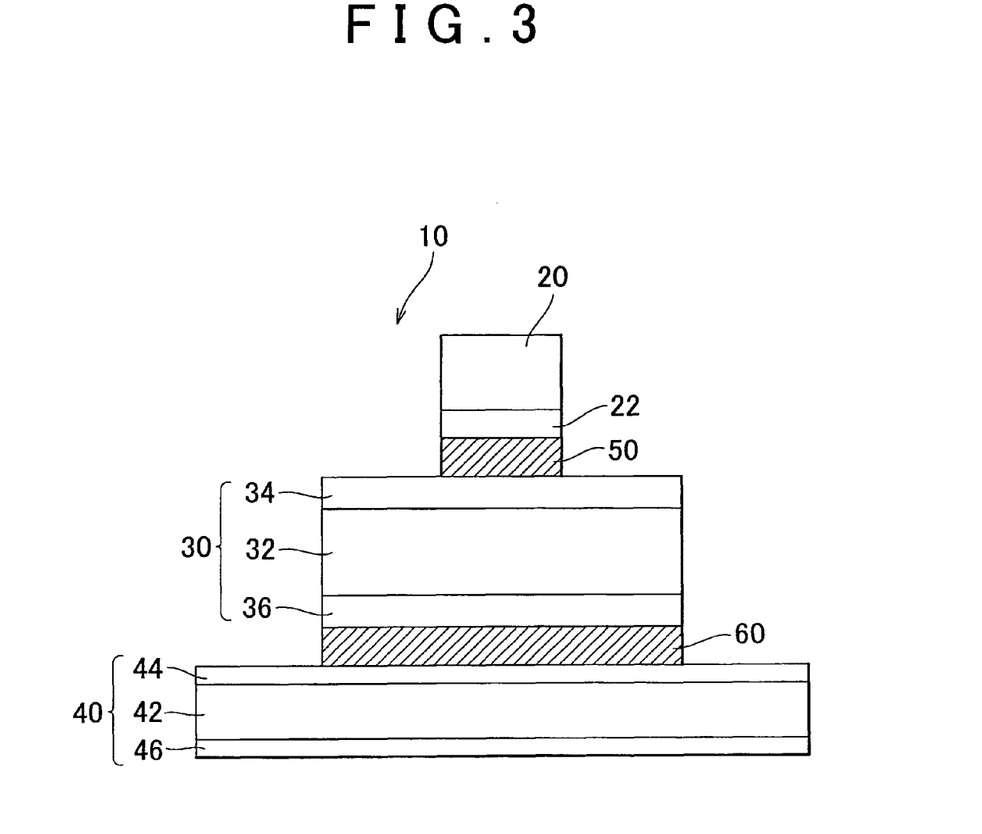
FIG. 3 is a schematic sectional view of portions of a semiconductor module according to the invention.

The semiconductor module of the invention has a semiconductor element, an insulating substrate, and a heat radiating plate. Furthermore, the semiconductor module has a first junction portion between the semiconductor element and the insulating substrate, and a second junction portion between the insulating substrate and the heat radiating plate. In the invention, it suffices that at least one of the first junction portion and the second junction portion is formed as the junction portion 210 in the invention which has been joined by the solder member 200 in accordance with the invention, and it is also permissible that both the first junction portion and the second junction portion are respectively joined with the solder member 200, and are thus formed as the junction portions 210 of the invention.

FIG. 3 shows a schematic sectional view of portions of the semiconductor module 10 of the invention. The semiconductor module 10 has a semiconductor element 20, an insulating portion 30, and a heat radiating plate 40. The semiconductor element 20 and the insulating portion 30 are joined together by a first junction portion 50. The insulating portion 30 and the heat radiating plate 40 are joined together by a second junction portion 60.

The semiconductor module 10 is for use in a vehicle-mounted inverter, or the like. An internal combustion engine, although not shown, is provided near the semiconductor module 10. Therefore, considerably high temperature occurs in an environment where the semiconductor module 10 is placed. Furthermore, in the case where GaN or SiC is used as a semiconductor element, the heat generation from the semiconductor element 20 is large, and the temperature of the semiconductor module 10 rises.

In order to prevent the semiconductor element being destroyed by heat generated by the semiconductor element itself or its high-temperature ambient environment, a cooling pipe (not shown) in which cooling water flows is provided, and a heat radiating plate 40 is provided between the cooling pipe and the semiconductor element.

Therefore, capability characteristics that are generally required of the semiconductor module are firstly a characteristic that defects, such as cracking, separation, etc., do not occur even after thermal shock cycles, secondly a characteristic that insulation is certainly realized by the insulating substrate, and thirdly a characteristic that heat produced from the semiconductor element is conducted to the heat radiating plate while accumulation of heat is avoided as much as possible.

In order to avoid the occurrence of cracking, separation, etc. due to thermal shock cycles, it is necessary that the relevant members, such as the semiconductor element, the insulating substrate, the heat radiating plate, the junction member, etc., be durable to changes in temperature, and it is important that unnecessary reaction products be not generated during thermal shock cycles. Such reaction products are brittle substances or, conversely, excessively hard substances, and cracking, separation or the like are likely to occur starting at the site of generation of a reaction product. Besides, it is important that the thermal expansion coefficients of the members be close to each other, in order to restrain the generation of cracking, separation, etc., caused by thermal shock cycles. If members whose thermal expansion coefficients are greatly different from each other are joined, cracking, separation, etc., are likely be to be caused by changes in volume of the members which repeatedly occur due to thermal shock cycles.

As for the semiconductor element 20, there is no particular restriction, but various materials may be appropriately applied according to the use of the semiconductor element 20, and it is possible to employ a commonly-used Si substrate, and also employ a GaN substrate, an SiC substrate, etc.

In the case where the first junction portion 50 is the junction portion 210 in accordance with the invention, the first junction portion 50-side surface of the semiconductor element 20 is provided with a Cu layer 22.

The thickness of the Cu layer 22 may be 0.1 µm to 20 µm, and may also be 0.5 µm to 10 µm. If the thickness of the Cu layer 22 is smaller than 0.1 µm, there is possibility of the Cu layer 22 dissolving and disappearing into the solder material during the joining process. If the thickness of the Cu layer 22 is thicker than 20 µm, the thermal expansion coefficient of the semiconductor module as a whole is affected so as to cause thermal stress. Thus, the thickness of the Cu layer 22 that is greater than 20 µm is not preferable. The Cu layer 22 can be formed on the surface of the junction portion by sputtering, plating, vapor deposition, etc.

As for the insulating substrate 32 of the insulating portion 30, any material can be applied without any particular restriction as long as the material secures insulation. However, the insulation substrate 32 has a thermal expansion coefficient that is similar to that of the semiconductor element so that remarkable thermal stress does not occur during thermal shock cycles.

Concretely, examples of the insulating substrate 32 include substrates formed of AlN, $Si_3N_4$, $Al_2O_3$, etc. Among these, AlN or $Si_3N_4$ may suitably be used for the insulating substrate 32, from the viewpoint of thermal conductivity and thermal expansion coefficient.

Besides, in order to conduct electricity from the semiconductor element-side surface of the insulating substrate 32 to the semiconductor element 20, an electrically conductive layer 34 is layered on the surface of AlN or $Si_3N_4$. Besides, in order to restrain the warpage due to changes in temperature, an electrically conductive layer 36 may be layered on the heat radiating plate 40 side as well.

Examples of the materials of the electrically conductive layers 34 and 36 include Al, Cu, Mo, Ni, etc. Among these, Al and Cu may suitably be used. If an Al layer is provided on a surface of AlN or $Si_3N_4$, plastic deformation occurs in response to change in temperature, so that thermal stress can be lessened. If a Cu layer is provided on a surface of AlN or $Si_3N_4$, the high electrical conductivity of Cu allows the electrically conductive layer to be reduced in thickness, so that thermal stress can be lessened. In particular, if the electrically conductive layers 34 and 36 are Cu layers, the Cu layers can also serve the role of the Cu layer provided on the joining surface.

The thickness of the electrically conductive layers 34 and 36 provided on the AlN or $Si_3N_4$ surfaces may be 0.01 mm to 2 mm, and may also be 0.1 mm to 1 mm. If the thickness of the electrically conductive layers is less than 0.01 mm, the loss and the heat generation due to electricity in lateral directions (directions perpendicular to the layer stacking direction) become remarkable; therefore, such thickness thereof is not preferable. If the thickness thereof exceeds 2 mm, the thermal expansion coefficient of the semiconductor module as a whole is affected so that thermal stress is caused; therefore, such thickness thereof is not preferable.

The electrically conductive layers 34 and 36 can be stuck to the insulating substrate 32 by a method such as brazing or the like.

In the case where the electrically conductive layers 34 and 36 are not Cu layers, a Cu layer (not shown) is formed on a surface of the insulating portion 30 which is on the side that is joined by the solder member 200. The Cu layer can be formed by sputtering, plating, vapor deposition, etc.

As for the heat radiating plate 40, any material can be applied without any particular restriction as long as the material has a heat radiating characteristic. However, a material whose thermal conductivity is sufficiently high, and which is excellent in the functions required of the heat radiating plate, and whose thermal expansion coefficient is similar to that of the semiconductor element, may suitably be used.

Concretely, examples of the heat radiating plate 40 include heat radiating plates that are formed from MO, Cu—Mo alloy, Al—SiC, Cu, Al, etc. Among these materials, Mo may suitably be used since Mo has high thermal conductivity, and a thermal expansion coefficient similar to that of the semiconductor element.

In the case where Mo is used for the heat radiating plate, the two surfaces of the Mo plate may be provided with layers of a material other than Mo, from the viewpoint of allowing the joining to be carried out. Example of such metal layers include layers of Cu, Ni, etc. In particular, from the viewpoint of making appropriate adjustment of the thermal conductivity and the thermal expansion coefficient, the heat radiating plate 40 may also be a stack of a Cu layer 44, an Mo layer 42 and a Cu layer 46 in which the Cu layers are provided on the two surfaces of the Mo layer.

In the case where the heat radiating plate 40 is a stack composed of the Cu layer 44, the Mo layer 42 and the Cu layer 46, the ratio of the thicknesses of the layers may be in the range of 1:5:1 to 1:12:1, and may also be in the range of 1:7:1 to 1:9:1. If the thickness ratio of the Cu layer 44, the Mo layer 42 and the Cu layer 46 is such that the relative thickness of the Mo layer is less than that represented by the thickness ratio of 1:5:1 of the three layers 44, 42 and 46, the thermal expansion coefficient of the heat radiating plate 40 is far from the thermal expansion coefficient of the semiconductor element. Therefore, such thickness ratio of the three layers is not preferable. Besides, if the thickness ratio of the Cu layer 44, the Mo layer 42 and the Cu layer 46 is such that the relative thickness of the Mo layer is thicker than that represented by the thickness ratio of 1:12:1, the heat radiating functions of the heat radiating plate cannot sufficiently be performed. Therefore, such thickness ratio of the three layers is not preferable.

As for the concrete thickness of the layers, the thicknesses of the Cu layers 44 and 46 may be 0.05 mm to 1 mm, and may also be 0.2 mm to 0.5 mm. The thickness of the Mo layer 42 may be 1 mm to 7 mm, and may also be 2 mm to 4 mm.

The total thickness of the stack composed of the Cu layer 44, the Mo layer 42 and the Cu layer 46 may be 1 mm to 8 mm, and may also be 2 mm to 5 mm, in order to sufficiently realize the heat radiating function.

As described above, the Cu layer 44 can also serve the role of the Cu layer that is provided on the joining surface that faces the junction portion 210. In the case where the second junction portion 60 is joined by the solder member 200, and where no Cu layer is provided on a surface of the heat radiating plate 40 as a portion thereof, a Cu layer (not shown) is formed on the second junction portion 60-side surface of the heat radiating plate 40. The Cu layer can be formed by sputtering, plating, vapor deposition, etc.

It suffices that at least one of the first junction portion 50 and the second junction portion 60 is provided as the junction portion 210 in accordance with the invention which is joined by using the solder member 200, and it is also permissible that the first junction portion 50 and the second junction portion 60 be both provided as the junction portion 210 in accordance with the invention.

The joining surface that faces the junction portion 210 in accordance with the invention is constructed of a material whose main component is copper. The copper layers 111 and 112 on the joining surfaces, as show in FIGS. 1A and 1B are provided as a portion of the insulating portion 30 or of the heat radiating plate 40 and that serves other functions as well. For example, such copper layers are the electrically conductive layers 34 and 36 of the insulating portion 30, and the Cu layer 44 of the heat radiating plate 40. In this case, the thicknesses of these layers are appropriately adjusted to such thicknesses that the functions of the layers can be realized.

In the case where at least one of the first junction portion 50 and the second junction portion 60 is joined by a material other than the solder member 200 in accordance with the invention, it is possible to appropriately apply a known junction material as the junction material other than the solder member 200.

As for the order in junction, either one of the first junction portion 50 and the second junction portion 60 may be joined first. Usually, in the semiconductor module manufacturing method, the second joining process is performed by heating the whole module including the portion joined in the first process. Therefore, in order to prevent the portion joined by the first process from deviating in position or from tilting, the heating temperature during the second joining process is made sufficiently lower than the melting point of the junction material used in the first process. That is, in a usual semiconductor module manufacturing method, material whose melting points are different from each other are used for the junction portion that is joined by the earlier (first) process, and for the junction portion that is joined by the later (second) process. In particular, as for the junction material used in the first process, a material having a sufficiently higher melting point than the material used in the second process may be selected.

Besides, considering the heat dissipation from the semiconductor element 20, a junction material having high melting point may be applied to the first junction portion 50. Therefore, the first junction portion 50 is first joined by using a junction material that has higher melting point, and then the second junction portion 60 is joined by using a junction material that has a lower melting point than the junction material used for the first junction portion 50.

Besides, in the case where a GaN substrate or an SiC substrate is applied to the semiconductor element 20, the heat dissipation from the semiconductor element 20 is great, so that heat may sometimes be generated, and raise the temperature beyond 200° C. Therefore, considering the melting point of the tin-base solder material in the solder member 200 (which is about 220° C.), the solder member 200 in accordance with the invention is applied to the junction portion that is joined in the second process so that the junction portion is formed as the junction portion 210 of the invention, and a solder member that has a higher melting point than the solder member 200 in accordance with the invention is applied to the junction portion that is joined in the first process.

On another hand, in the case of a semiconductor module in which an Si substrate is applied to the semiconductor element 20, the semiconductor module exhibits sufficient heat resistance even at the temperature of the melting point of the tin-base solder material (about 220° C.). Therefore, it is permissible that the solder member 200 in accordance with the invention is applied to the junction portion that is joined in the first process to form the junction portion 210 of the invention, and then a solder member that has a lower melting point than the solder member 200 in accordance with the invention is applied to the junction portion that is joined in the second process.

Incidentally, in the case of the semiconductor module in which an Si substrate is applied to the semiconductor element 20, it is also permissible that the solder member 200 in accordance with the invention may be applied to the junction portion that is joined in the second process so that the junction portion is formed as the junction portion 210, and that a solder member that has a higher melting point than the solder member 200 in accordance with the invention may be used for the junction portion that is joined in the first process, as in the case where a GaN substrate or an SiC substrate is applied to the semiconductor element 20.

In the case where the solder member 200 in accordance with the invention is applied to the junction portion that is joined in the second process, so that the junction portion is formed as the junction portion 210 in accordance with the invention, it is permissible that a material whose melting point is sufficiently higher than the melting point of the tin-base solder material (about 220° C.) may be selected for the junction portion that is joined in the first process, from the viewpoint of preventing the occurrence of defects, such as positional deviation, tilt, etc., during the second joining process, and it is also permissible that a material that can be joined at a temperature of 450° C. or lower may be selected for the junction portion that is joined in the first process, from the viewpoint of preventing the breakage or property modification of a joining member (e.g., the semiconductor element, or the like) caused by heating.

Examples of the materials whose melting point is sufficiently higher than the melting point of the tin-base solder material (about 220° C.) include a zinc-base solder material (melting point: about 420° C.), Au—Si (melting point: 360° C.), Au—Ge (melting point: 356° C.), Au—Sn (melting point: 270° C.), a Bi-base solder material (melting point: about 270° C.), etc.

The zinc-base solder material refers to a solder material that contains 50% by mass or more of zinc (Zn). Concretely, examples of the zinc-base solder material include Zn as a simple substance, Zn—Al alloy, and alloys represented by $Zn_{(1-x-y)}Al_xM_y$, and further include materials obtained by adding to any one of these materials one species selected from the group consisting of Ge, Mg, Sn, In, P, etc. or by adding a combination of two or more species selected from the group to any one of the foregoing solder materials. As the other zinc-base solder materials, it is possible to apply Zn-base solder materials described in: Japanese Patent Application Publication No. 11-288955 (JP-A-11-288955), Japanese Patent Application Publication No. 11-208487 (JP-A-11-208487), Japanese Patent Application Publication No. 11-172354 (JP-A-11-172354), Japanese Patent Application Publication No. 11-172353 (JP-A-11-172353), Japanese Patent Application Publication No. 11-172352 (JP-A-11-172352), Japanese Patent Application Publication No. 2000-208533 (JP-A-2000-208533), Japanese Patent Application Publication No. 2000-61686 (JP-A-2000-61686), Japanese Patent Application Publication No. 2004-358540 (JP-A-2004-358540), Japanese Patent Application Publication No. 2004-358539 (JP-A-2004-358539), etc.

It is to be noted herein that the melting point of zinc as a simple substance is about 420° C. Although the joining can be performed at about 420° C., it is also permissible to make the melting point of the zinc-base solder material lower than about 420° C., considering the thermal damage to the junction members.

In order to lower the melting point, Al may be added to Zn to form an alloy of Zn and Al. Besides Zn and Al, 2% by mass or less of a metal M may be contained in the solder material. That is, an alloy represented by $Zn_{(1-x-y)}Al_xM_y$ may be applied.

In the alloy represented by $Zn_{(1-x-y)}Al_xM_y$, the content rate of Al (the range of x) may be 2% by mass or more but 10% by mass or less, and may also be 3% by mass or more but 8% by mass or less. As for Zn as a simple substance, which does not contain either Al or M (x and y are 0), the melting point thereof is about 420° C. as described above. As the content rate of Al increases, the dissolution end temperature (liquid-phase line temperature) gradually lowers. If the content rate of Al is about 2% by mass, the dissolution end temperature (liquid-phase line temperature) is about 410° C. If the content rate of Al is about 4 to 6% by mass, the liquid-phase line temperature is about 382° C. If the content rate of Al is larger than about 6% by mass, the difference between the temperature at which the dissolution begins (solid-phase line temperature) and the temperature at which the dissolution ends (liquid-phase line temperature) becomes large. If the content rate of Al is 10% by mass, the solid-phase line temperature is about 382° C., and the liquid-phase line temperature is about 410° C. If the content rate of Al is larger than 10% by mass, the difference between the solid-phase line temperature and the liquid-phase line temperature is larger than 30° C., so that operability is low, and it becomes likely that defects, such as positional deviation, tilt of a junction member, etc. will occur when the joining by solder is performed.

Besides, the metal M in the alloy represented by $Zn_{(1-x-y)}Al_xM_y$ refers to a metal other than zinc and aluminum, and may be, for example, Cu, or the like. Containment of 2% by mass or less of Cu makes good wettability, and improves adherence. Incidentally, containment of 2% by mass of Cu causes substantially no change of the liquid-phase line temperature. In the alloy represented by $Zn_{(1-x-y)}Al_xM_y$, the content of the metal M (the range of y) is 0 to 2% by mass, and may also be 0 to 1.5% by mass. If the content of the metal M is greater than 2% by mass, the temperature difference (or change) that occurs in the course up to the end of dissolution becomes larger than 30° C., so that operability declines, and it is likely that defects, such as positional deviation, tilt of a junction member, etc., will occur when the joining is performed with solder.

The preparation method for the alloy represented by $Zn_{(1-x-y)}Al_xM_y$ is not particularly restricted, but known alloy preparation methods can be appropriately applied.

In the case where the first member 101 and the second member 102 are joined by an alloy represented by $Zn_{(1-x-y)}Al_xM_y$, the joining may be carried out at a temperature that is higher than the liquid-phase line temperature of the alloy by several tens degrees Celsius, from the viewpoint of uniformly melting the junction portions and obtaining sufficient fluidity. For example, in the case of an alloy $Zn_{(1-x-y)}Al_xM_y$ that has a liquid-phase line temperature of 382° C., the joining may be carried out at temperature of about 410° C. to 440° C.

A joining surface that faces the zinc-base solder material may be provided with a nickel layer. The provision of the nickel layer on the joining surface restrains the production of an unnecessary reaction product at the boundary with the zinc-base solder material, and heightens the resistance to changes in temperature.

The thickness of the nickel layer on the joining surface that faces the zinc-base solder member 200 may be 0.1 μm to 10 μm, and may also be 0.5 μm to 5 μm. The thickness of the nickel layer within the foregoing range will contribute to improvement of wettability, and the influence of the thermal expansion coefficient on the obtained junction body as a whole is small. The nickel layer may be formed on the joining surface that faces the zinc-base solder member 200, by sputtering, plating, vapor deposition, etc.

In the case where the solder member 200 in accordance with the invention is applied to the junction portion that is joined in the first process, so that the junction portion is formed as the junction portion 210 in accordance with the invention, a material that can be joined at temperature that is lower than the melting point of the solder member 200 may be selected for the junction portion that is joined in the second process, from the viewpoint of preventing the occurrence of defects, such as positional deviation, tilt, etc., during the second joining process.

It is to be noted herein that if the joining is carried out using the solder member 200, there exist a tin-base solder material, a copper tin alloy, and copper in the junction portion 210 after the joining process. The lowest melting point in the junction portion 210 is about 220° C., which is the melting point of the tin-base solder material. Hence, in the case where the solder member 200 is applied to the first joining process, a material that is joined at temperature that is lower than the melting point of the tin-base solder material (about 220° C.) may be adopted for the second joining process.

It is to be noted herein that in the case where the joining is carried out with the solder member 200 in accordance with the invention, a portion of the junction portion is joined by the copper-tin alloy 203. The junction portion joined by the copper-tin alloy 203 does not deviates in position at temperature below the melting point of the copper-tin alloy (e.g., about 640° C. in the case of $Cu_3Sn$, and about 415° C. in the case of $Cu_6Sn_5$), and the junction position is fixed. Hence, in the case where the solder member 200 is applied to the first joining process, it is also possible that, in the second joining process, the joining is carried out with a solder material whose melting point is higher than the melting point of the tin-base solder material (about 220° C.), and is lower than the melting point of the copper-tin alloy (e.g., 640° C. in the case of $Cu_3Sn$, and 415° C. in the case of $Cu_6Sn_5$). However, it is desirable to avoid using a solder material whose melting point is conspicuously higher than the melting point of the tin-base solder material (about 220° C.), to the second joining process.

As described above, when the solder member 200 in accordance with the invention is used in the first joining process, the solder material to be used in the second joining process may be an Sn-base solder material (melting point: about 220° C.), a Bi-base solder material (melting point: about 270° C.), an Au-base solder material (melting point: about 270° C.), an Sn—Sb-base solder material (melting point: about 250° C.), etc.

Examples of the Au-base solder material include Au-20Sn (melting point: 270° C.), Au-12.5Ge (melting point: 361° C.), etc.

In this invention, it is possible to apply the solder member 200 in accordance with the invention to both the junction portion that is joined in the first process and the junction portion that is joined in the second process.

In the manufacturing method of the invention, since the copper-tin alloy 203 is formed after the joining, the whole junction portion does not deviate in position at temperature below the melting point of the copper-tin alloy (e.g., 640° C. in the case of $Cu_3Sn$, and 415° C. in the case of $Cu_6Sn_5$), but the junction position is fixed.

Therefore, in the case where the junction portion that is joined in the first process is joined by the solder member 200 in accordance with the invention and where the junction portion that is joined in the second process is also joined by the solder member 200 in accordance with the invention, the junction position fixed in the first joining process does not deviate during the second joining process since the heating temperature in the second joining process (whose lower limit temperature is about 220° C., which is the melting point of Sn) is sufficiently lower than the melting point of the copper-tin alloy (e.g., 640° C. in the case of $Cu_3Sn$, and 415° C. in the case of $Cu_6Sn_5$).

Thus, in the semiconductor module of the invention, the same junction material can be applied to two different sites, so that the operation is simplified and the space required for the manufacture thereof can be reduced.

However, in the case where the solder member 200 of the invention is applied to both the junction portion that is joined in the first process and the junction portion that is joined in the second process, the junction portion that is joined in the first process include portions that are joined by the tin-base solder material, so that the junction portion joined in the first process melts partially due to the heating in the second joining process. Therefore, if high heat resistance is desired, it is preferable that the first joining process be carried out using a solder material other than the solder member 200 in accordance with the invention, and the second joining process be carried out using the solder member 200 in accordance with the invention.

In the semiconductor module manufacturing method in accordance with the invention, at least one of a junction portion between a semiconductor element and an insulating substrate and a junction portion between the insulating substrate and a heat radiating plate is joined by the foregoing junction body manufacturing method. Concrete joining methods will be described below.

A first embodiment will be described in conjunction with the case where the solder member 200 in accordance with the invention is applied to the first junction portion 50 so that the first junction portion 50 is formed as the junction portion 210 in accordance with the invention, and where a solder material other than the solder member 200 is used for the second junction portion 60.

In the case where in this embodiment a GaN substrate or an SiC substrate is used for the semiconductor element, it is permissible, from the viewpoint of the melting point of the junction portion 210 in accordance with the invention, that the second junction portion 60 be first joined using a solder material that has a higher melting point than the solder member 200 in accordance with the invention, and then the first junction portion 50 be joined using the solder member 200 in accordance with the invention so that the first junction portion 50 is formed as the junction portion 210 in accordance with the invention. On another hand, in the case where in this embodiment an Si substrate is used for the semiconductor element, either one of the first junction portion 50 and the second junction portion 60 may be joined first.

Hereinafter, the first embodiment will be described in conjunction with a method in which the second junction portion 60 is first joined using a solder material that has a higher melting point than the solder member 200 in accordance with the invention, and then the first junction portion 50 in accordance with the invention is joined using the solder member 200 in accordance with the invention so that the first junction portion 50 is formed as the junction portion 210 in accordance with the invention.

The insulating portion 30 and the heat radiating plate 40 are disposed facing each other, and a solder material for use for the second junction portion 60 is sandwiched therebetween. In a state where the insulating portion 30, the solder material 30 and the heat radiating plate 40 are stacked in that order, the stacked components are joined in an inactive gas atmosphere or a reducing gas atmosphere, by using a reflow process, or the like.

As for the joining temperature of the second junction portion 60, it is preferable to join the second junction portion 60 at a temperature that is about 30° C. to 60° C. higher than the melting point of the solder material of the second junction portion 60.

The thickness of the second junction portion 60 may be 5 µm or more but 500 µm or less, and may also be 10 µm or more but 300 µm or less, from the viewpoint of thermal conduction and thermal stress.

A Cu layer is formed by sputtering on a junction surface-side surface of the semiconductor element 20. On the other hand, a Cu plate as an electrically conductive layer is stuck to a first junction portion 50-side joining surface of the insulating portion 30, by a method such as brazing or the like. In addition, a surface of the insulating portion 30 opposite the first junction portion 50 side has already been joined with the heat radiating plate 40 by the foregoing second junction portion 60.

The semiconductor element 20 and the insulating portion 30 are disposed so that the Cu layers provided respectively on the two members face each other, and the solder member 200 in accordance with the invention is sandwiched between the two members. Then, the stack is pressurized by a jig or the like in the stacking direction so as to secure adhesiveness and uniformity of the junction portion. A metal-made weight may be placed on top of the semiconductor element for the pressurization.

While this state is maintained, the joining is performed by a heat process, using a reflow process or the like, in an inactive-gas or reducing-gas atmosphere. The heating temperature is set so as to be higher than the melting point of the tin-base solder material 202 but lower than the melting point of copper. If the heating temperature is not higher than the melting point of the tin-base solder material 202, the tin-base solder material 202 does not melt, and therefore the joining is not achieved. Besides, at such low temperature, reaction does not occur between the copper solid and the tin liquid, and therefore the copper-tin alloy 203 is not formed. On the other hand, if the heating temperature is higher than the melting point of copper, the copper in the joining surface melts, and therefore there is possibility of occurrence of positional deviation of the junction portion, tilt thereof, etc. Furthermore, the semiconductor element 20 is destroyed, or modified in property.

Besides, the heating temperature for the joining of the first junction portion 50 may be a temperature that is higher than the melting point of the tin-base solder material 202 (220° C.), but is at least 30° C. lower than the melting point of the solder material used for the second junction portion 60. In order to prevent the destruction of the semiconductor element caused by the heating in the joining process, the heating for the joining may be performed at 450° C. or lower.

Furthermore, if the heating is performed at temperature near the melting point of the tin-base solder material 202 (220° C.), an increased duration of heating reaction is required in order to produce the copper-tin alloy 203 whose thickness is in the foregoing range, and therefore a long operation time is needed. Therefore, in view of the balance with the heating reaction duration, the lower limit of the heating temperature is, for example, 250° C.

The heating duration, as described above in conjunction with the junction body manufacturing method, is appropriately adjusted according to the heating temperature, the content rate of the three-dimensional web structure 201 in the solder member 200, etc.

The thickness of the layer of the first junction portion 50 formed may be 5 μm or more but 500 μm or less, and may also be 10 μm or more but 200 μm or less, from the viewpoint of thermal conduction and thermal stress.

In the first embodiment, the solder material selected for use for the first joining process is a solder material whose melting point is higher than the melting point (about 220° C.) of the tin-base solder material 202 for the solder member 200 in accordance with the invention which is for use for the second joining process. This avoids a defect in which the portion soldered in the first (earlier) soldering process melts during the second (later) soldering process, resulting in positional deviation, tilting, or the like.

In the semiconductor module of the first embodiment, the solder member 200 in accordance with the invention is applied to the first junction portion 50 so that the first junction portion 50 is formed as the junction portion 210 in accordance with the invention, and a solder material other than the solder member 200 is used for the second junction portion 60 so that the second junction portion 60 is formed as a junction portion other than the junction portion 210 in accordance with the invention. In a semiconductor module in accordance with a second embodiment, however, a solder material other than the solder member 200 in accordance with the invention is used for the first junction portion 50, and the solder member 200 in accordance with the invention is applied to the second junction portion 60 so that the second junction portion 60 is formed as the junction portion 210 in accordance with the invention.

An insulating portion 30 is prepared in which a Cu plate as an electrically conductive layer is stuck to a heat radiating plate 40 side of the insulating portion 30 by a method such as brazing or the like. Besides, a heat radiating plate 40 is prepared in which a Cu plate is stuck to an insulating portion 30 side of the heat radiating plate 40 by a method such as brazing or the like.

In the semiconductor module of the second embodiment, the first junction portion 50 is first joined, and the second junction portion 60 is joined in the second joining process. Other features and the like of the semiconductor module of the second embodiment are substantially the same as those of the semiconductor module of the first embodiment, and descriptions of such features and the like are omitted below.

In the second embodiment, the first junction portion 50 provided at a side closer to the semiconductor element, which produces a large amount of heat, can be joined by a solder material whose melting point is higher than the melting point of the material 200 in accordance with the invention. Therefore, a semiconductor module excellent in heat resistance is obtained.

In a third embodiment, the first junction portion and the second junction portion are each formed as the junction portion 210 in accordance with the invention. In a semiconductor module of the third embodiment, the joining surface of each of the first junction portion 50 and the second junction portion 60 is provided with a copper layer.

Considering the melting point of the tin-base solder material (220° C.) and the melting point of a copper-tin alloy (e.g., 640° C. in the case of $Cu_3Sn$, and 415° C. in the case of . $Cu_6Sn_5$), both the first joining process and the second joining process may be carried out by heating at a temperature of 260° C. to 290° C. which is 30° C. to 60° C. higher than the melting point of the tin-base solder material 202.

Other features and the like of the semiconductor module of the second embodiment are substantially the same as those of the semiconductor module of the first embodiment, and descriptions of such features and the like are omitted below.

In the semiconductor module of the invention, since the three-dimensional web structure and the joining surfaces are joined by a copper-tin alloy that is excellent in strength and thermal stress resistance, the strength of the layered structural body as a whole improves. Thus, a structural body that does not easily break even when subjected thermal stress such as thermal shock cycles is obtained. As a result, expansion of the difference in thermal expansion coefficient between component materials is permitted, so that various component materials can be adopted, and a low-cost junction body (e.g., a low-cost electric power transformer, or the like) can be realized.

Besides, even when the boundary between the copper of each joining surface and the copper-tin alloy of the junction member is subjected to thermal shock cycles, no unnecessary product is generated at the boundary, or hardly any growth of an unnecessary product occurs if any generated. Therefore, in the semiconductor module of the invention, the resistance to changes in temperature heightens.

Furthermore, since the three-dimensional web structure 201 contained in the solder member 200 contains highly heat-conductive copper as a main component, the heat conductivity of the junction body also increases as compared with the case where the solder member 200 contains only the tin-base solder material 202.

The invention will be described below with reference to working examples or the like, which are mere examples. The invention is not limited to the following examples.

EXAMPLE 1

A semiconductor element incorporating GaN was prepared, and a copper layer of 5 μm was formed on a surface of the semiconductor element by sputtering.

A copper plate was prepared as a counterpart joining member.

A solder foil member containing a foamed copper (190 μm in thickness) in a tin-base solder material (composition: Sn-0.7Cu) (by Mitsubishi Materials Corporation, trade name: Solder-Impregnated Foamed Copper) was prepared. The content rate of the foamed copper in the solder foil member was 20% by volume.

The foamed copper was positioned at an average depth of 2 to 10 μm from the surface of the solder foil member: After the foamed copper was submerged so as not to be exposed in the surface, the solder foil member was rolled, and then was polished. The thickness of the solder foil member obtained was 200 μm.

After the semiconductor element and the copper plate were placed so that the Cu layer of the semiconductor element and the copper plate face each other, and the solder foil member was sandwiched therebetween, and was fixed by a jig. Then, a metal-made weight was placed on top of the semiconductor element for pressing in the stacking direction. Incidentally, considering thermal expansion, a jig made of a molybdenum material was used. The pressed specimen and the jig were directly placed into a quartz tube. After the quartz tube was placed in an electric furnace that had therein a reducing atmosphere containing 5% by volume of $H_2$, heating was performed at 350° C. for 30 minutes, so that a junction body 1 was fabricated.

After cooling, the junction body 1 was taken out of the electric furnace, and was cut. As a result of electron microscopic observation of the sectional surface of the junction body 1, it was confirmed that the copper of the joining bodies and the foamed copper were joined by $Cu_3Sn$ alloy. An average thickness of the $Cu_3Sn$ alloy was 5 μm. Besides, the occupancy rate of the $Cu_3Sn$ alloy in the joining surfaces which was calculated using the foregoing expression was 20% in terms of length.

After the obtained junction body 1 was placed in a thermal shock apparatus, a thermal shock cycle test was performed. In the thermal shock cycle test in this example, a cycle of raising and lowering temperature between −40° C. and 105° C. in 40 minutes were performed 500 times (500 cycles). After the 500 cycles, the cross-section of the junction portion was observed in the same method as described above. As a result, a defect, such as cracking or the like, was not found in the interior of the junction portion, nor at the boundaries between the junction portion and the joining bodies, and thus it was confirmed that the junction body 1 had good reliability.

EXAMPLE 2

A junction body 2 was fabricated in substantially the same manner as in Example 1, except that the heating temperature was changed to 400° C. As a result of electron microscopic observation of the cross-section of the junction body 2 obtained, it was confirmed that the copper of the joining bodies and the foamed copper were joined by the $Cu_3Sn$ alloy. An average thickness of the $Cu_3Sn$ alloy was 8 μm. Besides, the occupancy rate of the $Cu_3Sn$ alloy in the joining surfaces which was calculated using the foregoing expression was 30% in terms of length.

The junction body 2 was also subjected to the foregoing thermal shock cycle test. As a result, a defect, such as crack or the like, was not found in the interior of the junction portion, nor at the boundaries between the junction portion and the joining bodies, and thus it was confirmed that the junction body 2 had good reliability.

EXAMPLE 3

A junction body 3 was fabricated in substantially the same manner as in Example 1, except that the heating temperature was changed to 450° C. As a result of electron microscopic observation of the cross-section of the junction body 3 obtained, it was confirmed that the copper of the joining bodies and the foamed copper were joined by the $Cu_3Sn$ alloy. An average thickness of the $Cu_3Sn$ alloy was 10 μm. Besides, the occupancy rate of the $Cu_3Sn$ alloy in the joining surfaces which was calculated using the foregoing expression was 35% in terms of length.

The junction body 3 was also subjected to the foregoing thermal shock cycle test. As a result, a defect, such as crack or the like, was not found in the interior of the junction portion, nor at the boundaries between the junction portion and the joining bodies, and thus it was confirmed that the junction body 3 had good reliability.

EXAMPLE 4

A solder foil member was prepared in substantially the same manner of preparation of a solder member as in Example 1, except that adjustment was performed such that foamed copper was positioned at an average depth of 1 to 5 μm from the surface of the solder foil member. A junction body 4 was fabricated in substantially the same manner as in Example 1, except that the foregoing solder foil member was used. As a result of electron microscopic observation of the cross-section of the junction body 4 obtained, it was confirmed that the copper of the joining bodies and the foamed copper were joined by the $Cu_3Sn$ alloy. An average thickness of the $Cu_3Sn$ alloy was 3 μm. Besides, the occupancy rate of the $Cu_3Sn$ alloy in the joining surfaces which was calculated using the foregoing expression was 15% in terms of length.

The junction body 4 was subjected to the foregoing thermal shock cycle test. As a result, a defect, such as crack or the like, was not found in the interior of the junction portion, nor at the boundaries between the junction portion and the joining bodies, and thus it was confirmed that the junction body 3 had good reliability.

EXAMPLE 5

A solder foil member was prepared in substantially the same manner of preparation of a solder member as in Example 1, except that adjustment was performed such that foamed copper was positioned at an average depth of 0 to 2 μm from the surface of the solder foil member. A junction body 5 was fabricated in substantially the same manner as in Example 1, except that the foregoing solder foil member was used. As a result of electron microscopic observation of the cross-section of the junction body 5 obtained, it was confirmed that $Cu_3Sn$ alloy was produced between the copper of the joining bodies and the foamed copper, and an average thickness of the $Cu_3Sn$ alloy was 1 μm. Besides, the occupancy rate of the $Cu_3Sn$ alloy in the joining surfaces which was calculated using the foregoing expression was 3% in terms of length.

The junction body 5 was subjected to the foregoing thermal shock cycle test. As a result, a defect, such as crack or the like, was found partially at the boundaries between the junction portion and the joining bodies, although the extent or degree of the defect was within a practically tolerable range.

EXAMPLE 6

A solder foil member was prepared in substantially the same manner of preparation of a solder member as in Example 1, except that adjustment was performed such that foamed copper was positioned at an average depth of 10 to 30 μm from the surface of the solder foil member. A junction body 6 was fabricated in substantially the same manner as in Example 1, except that the foregoing solder foil member was used. As a result of electron microscopic observation of the cross-section of the junction body 6 obtained, it was confirmed that $Cu_3Sn$ alloy was produced between the copper of the joining bodies and the foamed copper, and an average thickness of the $Cu_3Sn$ alloy was 30 μm. The composition of $Cu_3Sn$ alloy was checked, and it was found that the $Cu_3Sn$ alloy was mixed with $Cu_6Sn_5$ and Sn-0.7Cu, and therefore was not a uniform $Cu_3Sn$ alloy.

The junction body 6 was subjected to the foregoing thermal shock cycle test. As a result, a defect, such as crack or the like, was found partially at the boundaries between the junction portion and the joining bodies, although the extent or degree of the defect was within a practically tolerable range.

Comparative Example 1

A comparative junction body 1 was fabricated in substantially the same manner as in Example 1, except that the foamed copper was replaced with a tin-base solder member (composition: Sn-0.7Cu). The comparative junction body 1 obtained was subjected to the foregoing thermal shock cycle test, and was found to have remarkable cracks within the solder.

Comparative Example 2

A comparative junction body 2 was fabricated in substantially the same manner as in Example 1, except that a joining member having an Ni layer on a surface thereof was used. The Ni layer was formed by sputtering. The comparative junction body 2 obtained was subjected to the foregoing thermal shock cycle test. Although a defect, such as crack or the like, was not found within the solder, it was observed that remarkable cracks had occurred at the boundary between the Ni layer, which was a joining surface, and the solder member.

The invention claimed is:

1. A junction body characterized by comprising:
a first member having a first joining surface whose main component is copper;
a second member having a second joining surface whose main component is copper;
a solder member that is provided between the first joining surface and the second joining surface, and that contains, in a tin-base solder material, a three-dimensional web structure whose main component is copper; and
a copper-tin alloy formed between the first joining surface and the three-dimensional web structure, and between the second joining surface and the three-dimensional web structure;
wherein an average thickness of the copper-tin alloy is 2 μm or more but 20 μm or less.

2. The junction body according to claim 1, wherein the copper-tin alloy contains $Cu_3Sn$.

3. The junction body according to claim 1, wherein an occupancy rate of the copper-tin alloy in the joining surface is 2% or more but 50% or less.

4. The junction body according to claim 1, wherein a content rate of the three-dimensional web structure in the solder member is 2% by volume or more but 50% by volume or less.

5. The junction body according to claim 1, wherein a content rate of tin in the tin-base solder material is 90% by mass or more.

6. The junction body according to claim 1, wherein the tin-base solder material contains at least one element selected from the group consisting of Ag, Cu, Sb, Bi, In and Zn.

7. The junction body according to claim 6, wherein the tin-base solder material is Sn—Ag—Cu solder, Sn—Cu solder, Sn—Sb solder, Sn—Zn solder, Sn—Bi solder, Sn—In solder, Sn—Ag—Cu—Bi—In solder, or Sn—Ag—Cu—In solder.

8. The junction body according to claim 1, wherein the three-dimensional web structure is a foamed metal material, a knit of copper fiber, or a bundle of copper fiber.

9. The junction body according to claim 1, wherein the three-dimensional web structure contains 50% by mass or more of copper.

10. A semiconductor module characterized by comprising:
a semiconductor element provided with a first joining surface whose main component is copper;
an insulating substrate provided with a second with a second joining surface whose main component is copper;
a solder, member that is provided between the first joining surface and the second joining surface, and that contains, in a tin-base solder material, a three-dimension web structure whose main component is copper;
a copper-tin alloy formed between the first joining surface and the three-dimensional web structure, and between the second joining surface and the three-dimensional web structure;
wherein an average thickness of the copper-tin alloy is 2 μm or more but 20 μm or less; and
a heat radiating plate.

11. A semiconductor module characterized by comprising:
a semiconductor element;
an insulating substrate provided with a first joining surface whose main component is copper;
a heat radiating plate provided with a second joining surface whose main component is copper;
a solder member that is provided between the first joining surface and the second joining surface, and that contains, in a tin-base solder material, a three-dimensional web structure whose main component is copper; and
a copper-tin alloy formed between the first joining surface and the three-dimensional web structure, and between the second joining surface and the three-dimensional web structure;
wherein an average thickness of the copper-tin alloy is 2 μm or more but 20 μm or less.

12. The semiconductor module according to claim 10, wherein the copper-tin alloy contains $Cu_3Sn$.

13. The semiconductor module according to claim 10, wherein an occupancy rate of the copper-tin alloy in the joining surface is 2% or more but 50% or less.

14. The semiconductor module according to claim 10, wherein a content rate of the three-dimensional web structure in the solder member is 2% by volume or more but 50% by volume or less.

15. The semiconductor module according to claim 10, wherein a content rate of tin in the tin-base solder material is 90% by mass or more.

16. The semiconductor module according to claim 10, wherein the tin-base solder material contains at least one element selected from the group consisting of Ag, Cu, Sb, Bi, In and Zn.

17. The semiconductor module according to claim 16, wherein the tin-base solder material is Sn—Ag—Cu solder, Sn—Cu solder, Sn—Sb solder, Sn—Zn solder, Sn—Bi solder, Sn—In solder, Sn—Ag—Cu—Bi—In solder, or Sn—Ag—Cu—In solder.

18. The semiconductor module according to claim 10, wherein the heat radiating plate is a stack of a Cu layer, an Mo layer and a Cu layer in which the Cu layers are provided on two opposite sides of the Mo layer.

19. The semiconductor module according to claim 18, wherein a thickness ratio of the Cu layer, the Mo layer and the Cu layer is 1:5:1 to 1:12:1.

20. The semiconductor module according to claim 10, wherein the insulating substrate is an AlN or $Si_3N_4$ layer, and electrically conductive layers formed of Cu layers are layered on two opposite sides of the AlN or $Si_3N_4$ layer.

21. The semiconductor module according to claim 10, wherein the three-dimensional web structure is a foamed metal material, a knit of copper fiber, or a bundle of copper fiber.

22. The semiconductor module according to claim 10, wherein the three-dimensional web structure contains 50% by mass or more of copper.

23. The semiconductor module according to claim 10, wherein the three-dimensional web structure is provided at a position that is 2 μm or more but 50 μm or less from a surface of the solder member.

24. A junction body manufacturing method characterized by comprising:
disposing a first member and a second member each of which has a joining surface whose main component is copper so that the joining surface of the first member and the joining surface of the second member face each other;
disposing a solder member that contains, in a tin-base solder material, a three-dimensional web structure whose main component is copper, between the joining surface of the first member and the joining surface of the second member;
producing a copper-tin alloy between the joining surface of the first member and the three-dimensional web structure, and between the joining surface of the second member and the three-dimensional web structure, by heating at a temperature that is higher than a melting point of the tin-base solder material but lower than a melting point of copper;
wherein an average thickness of the copper-tin alloy is 2 μm or more but 20 μm or less.

25. The junction body manufacturing method according to claim 24, wherein heating is performed while positions of the joining surfaces and the three-dimensional web structure are adjusted so that an average thickness of the copper-tin alloy becomes 2 μm or more but 20 μm or less.

26. The junction body manufacturing method according to claim 24, wherein at least one of temperature of heating and duration of heating is adjusted so that the average thickness of the copper-tin alloy becomes 2 μm or more but 20 μm or less.

27. The junction body manufacturing method according to claim 24, wherein the copper-tin alloy contains $Cu_3Sn$.

28. The junction body manufacturing method according to claim 24, wherein at least one of temperature of heating and duration of heating is adjusted so that an occupancy rate of the copper-tin alloy in the joining surface of the first member and the joining surface of the second member becomes 2% or more but 50% or less.

29. The junction body manufacturing method according to claim 24, wherein the solder member in which a content rate of the three-dimensional web structure is 2% by volume or more but 50% by volume or less is used.

30. The junction body manufacturing method according to claim 24, wherein:
the first member is a semiconductor element;
the second member is an insulating substrate; and
the junction body is a semiconductor module.

31. The junction body manufacturing method according to claim 24, wherein:
the first member is an insulating substrate;
the second member is a heat radiating plate; and
the junction body is a semiconductor module.

32. The junction body manufacturing method according to claim 30, wherein heating is performed at 450° C. or lower.

* * * * *